United States Patent [19]

Farley

[11] Patent Number: 4,539,217

[45] Date of Patent: Sep. 3, 1985

[54] DOSE CONTROL METHOD

[75] Inventor: Marvin Farley, Ipswich, Mass.

[73] Assignee: Eaton Corporation, Cleveland, Ohio

[21] Appl. No.: 625,263

[22] Filed: Jun. 27, 1984

[51] Int. Cl.³ .............................................. B05D 3/06
[52] U.S. Cl. ...................................... 427/10; 427/38
[58] Field of Search ................................... 427/10, 38

*Primary Examiner*—Bernard D. Pianalto
*Attorney, Agent, or Firm*—C. H. Grace; F. M. Sajovec

[57] ABSTRACT

A method and apparatus for measuring and compensating for neutral ions in an ion beam in the dose control system of an ion implanter. The gas pressure in the implantation volume (15) is measured, and the pressure signal is converted to an effective beam current signal in accordance with a known relationship among the gas pressure, the apparent beam current as measured by a Faraday cage and the neutral beam. The resulting effective beam current signal is inputted to the dose control system.

4 Claims, 5 Drawing Figures

DOSE CONTROL METHOD

The present invention relates generally to ion implanters, and more specifically to a method and apparatus for controlling the dosage of ions implanted into semiconductor wafers which are coated with a photoresist.

Ion implantation is now widely used in a variety of industrial applications, especially in the implantation of semiconductors for manufacturing electrically active devices. For many such purposes it is essential that the implantation dose onto the workpiece be accurately measured and controlled. The allowable tolerances on the uniformity and the total dose of the implants in the manufacturing of semiconductor devices are now at the 1% level in many applications. At this level of accuracy it is necessary to take into account the neutralization of the ions along the beam path as a result of collisions with residual atoms and electrons in the implanter volume.

Faraday cages, which trap and measure the ion beam current while blocking the escape of electrons from within the cage and excluding electrons which might accompany the beam are universally used to measure the implantation dose; however, neutral atoms in the beams are not detected by the Faraday cage. Since neutralized atoms have essentially the same energy as the ions and are individually equivalent to them insofar as implantation dose is concerned, if significant neutralization of the beam takes place, the Faraday cage reading will give a false measure of the true implantation. Of particular concern is the implantation into semiconductor surfaces which outgas, volatilize or sputter, such as semiconductor workpieces which are coated with photoresist. For example, when the implanter vacuum is low enough, the implanted species is essentially a singly charged positive ion selected by the analyzing magnet of the implanter. If, however, the pressure along the path between the analyzing magnet and the workpiece is not low enough, the ion beam may change its charge state through atomic collisions with the residual gas atoms, without undergoing a significant change in energy. In that event, the beam striking the Faraday cage may contain neutral atoms. These neutralized particles are the desired species and have the desired energies for the implantation, thus they should be counted in the flux; however, the Faraday cage is not capable of counting these particles.

The present invention automatically compensates in an accurate and rapid manner for implantation ions which have been neutralized by interactions with gas atoms in the flight path to the wafer being implanted. The invention makes use of the fact that the amount of neutralization is a function of the gas pressure in the implantation volume. Over a wide range of pressures encountered in implantation devices, the function is essentially linear. A measurement of the ionization current versus pressure is used in the implanter control system to generate a correction signal which compensates for the change in detected ions as the pressure varies. This allows the implantation dose to be monitored and controlled to an uncertainty of less than one percent.

Other objects and advantages of the invention will be apparent from the following description when considered in relation with the accompanying drawings, wherein:

DETAILED DESCRIPTION OF THE DRAWINGS

Figure 1:
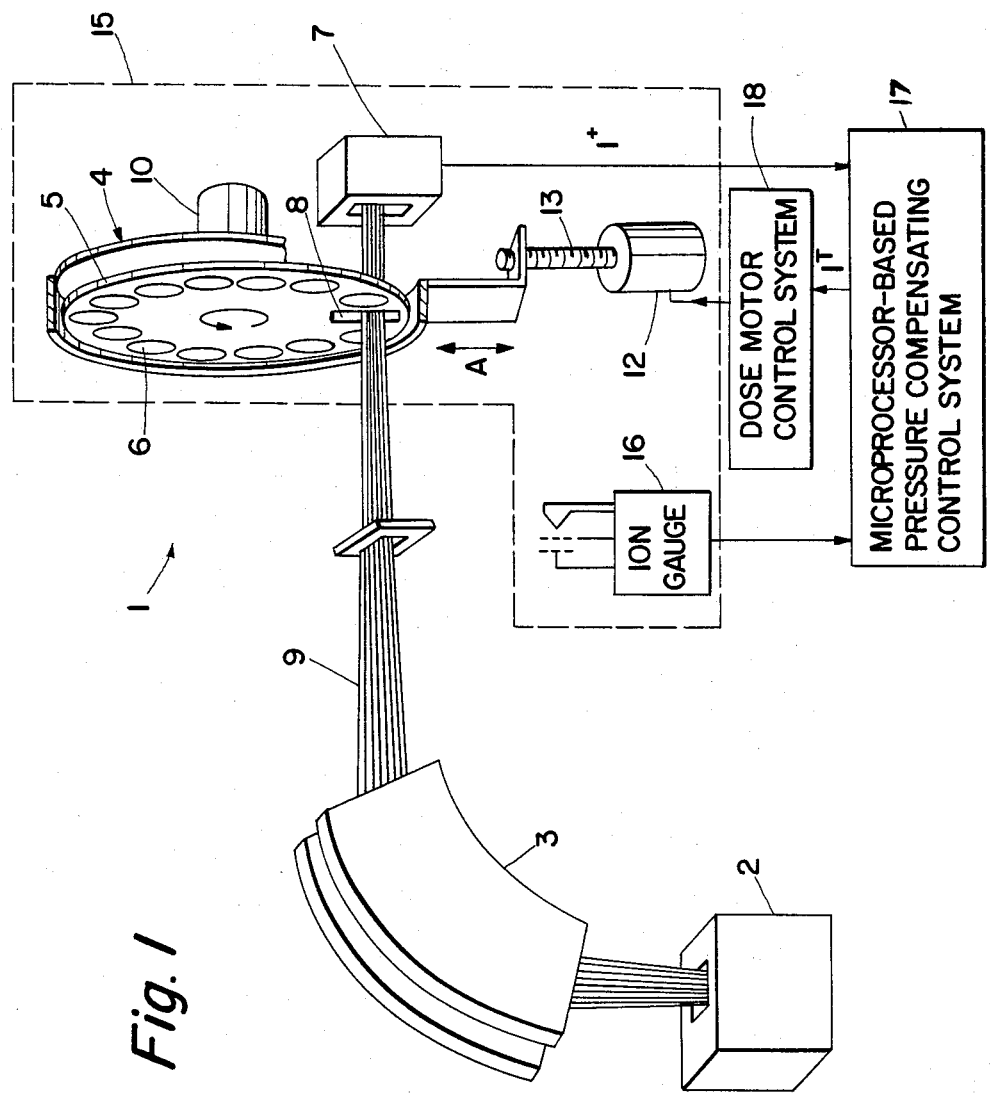
FIG. 1 is a schematic representation of the invention.

Referring to FIG. 1, there is illustrated schematically an ion implanter designated generally by the numeral 1, comprising an ion source 2, an analyzing magnet 3, a rotating disk assembly 4 including a disk 5 on which workpieces 6 are mounted for implantation, and a Faraday cage 7 which is used to measure the ion beam current which passes through a slot 8 formed in the disk. As is well known in the art, certain ion species are selected by the analyzing magnet, resulting in a beam 9 of the selected species being directed against the workpiece.

As set forth in U.S. Pat. No. 4,234,797 to Geoffrey Ryding, which is incorporated herein by reference, the disk 5 is rotated at a constant angular velocity by a motor 10 mounted on the disk assembly 4, and the disk assembly is moved in the direction of the arrow A by means of a stepper motor 12 and lead screw 13 at a rate which is determined by the dose as measured by the Faraday cage 7 to insure the uniform implantation of the workpiece 6.

As is well known in the art, ion implantation is carried out under high vacuum conditions, with the disk assembly 4 and the Faraday cage 7 defining an end station or target chamber designated by the broken line 15 in FIG. 1. The present invention provides a means for accounting for the neutralized ions in the dose measurement by providing a correction signal to the dose control system which is based on the measurement of ionization current versus the pressure at the end station 15.

Figure 2:
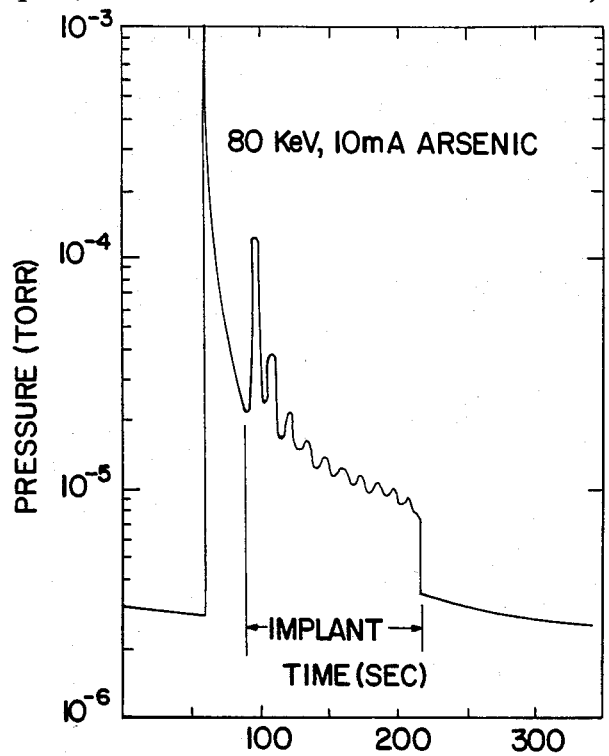
FIG. 2 is a graph showing end station pressure as a function of time during an implantation cycle.

The end station pressure is measured by an ionization gauge 16. As shown in FIG. 2, the end station pressure as a function of time during pump-down and implantation (using arsenic as an example) of a batch of wafers covered with positive photoresist oscillates in correspondence to the radial scans of the spinning disk 5 holding the workpiece wafers 6. Large pressure changes of about a factor of 10 are observed during the first passes of the beam across the workpieces.

The collisions of the primary positive ion beam 9, designate herein as the incident current I+, with the gas atoms along its path causes electrons to be added to or taken away from some of the positive ions with probabilities which depend on the ion species, the ion velocity and the gas through which the ion passes. The resulting beam I (incident) at the implantation surface has components with different charges:

$$I^+(Incident) = I^0 + I^- + I^+ + I^{++} + \text{etc.} \tag{1}$$

where $I^0$ is the number of neutral particles per second, $I^-$ is the current of negatively charged ions per second (one electron excess), $I^+$ is the current of singly charged positive ions, and $I^{++}$ is the current of ions with two electrons missing. The present invention takes account of the pressure dependence of the charge-changing interactions which cause the incident current at the implantation surface to fractionate into many charge components. Often, however, over the range of species, ion energies and tank pressures of significance to ion implantation of semiconductor devices, only the neutral and singly-ionized components are important. Therefore only these two components are considered in the expositions which follow. Thus, $$I^T = I^+ + I^0 \qquad (2)$$

where $I^T$ stands for the approximate true current of implanted particle species, $I^0$ is the neutral component of that current and $I^+$ is the singly ionized positive component of current. By the nature of the Faraday cage 7 behind the slot 8 in the rotating disk 5, is described in the U.S. Pat. No. 4,234,797, components of current equal to these implanted components also enter the Faraday cage 7 and the singly ionized positive current being implanted is equal to that measured by the Faraday cage 7.

Figure 3:
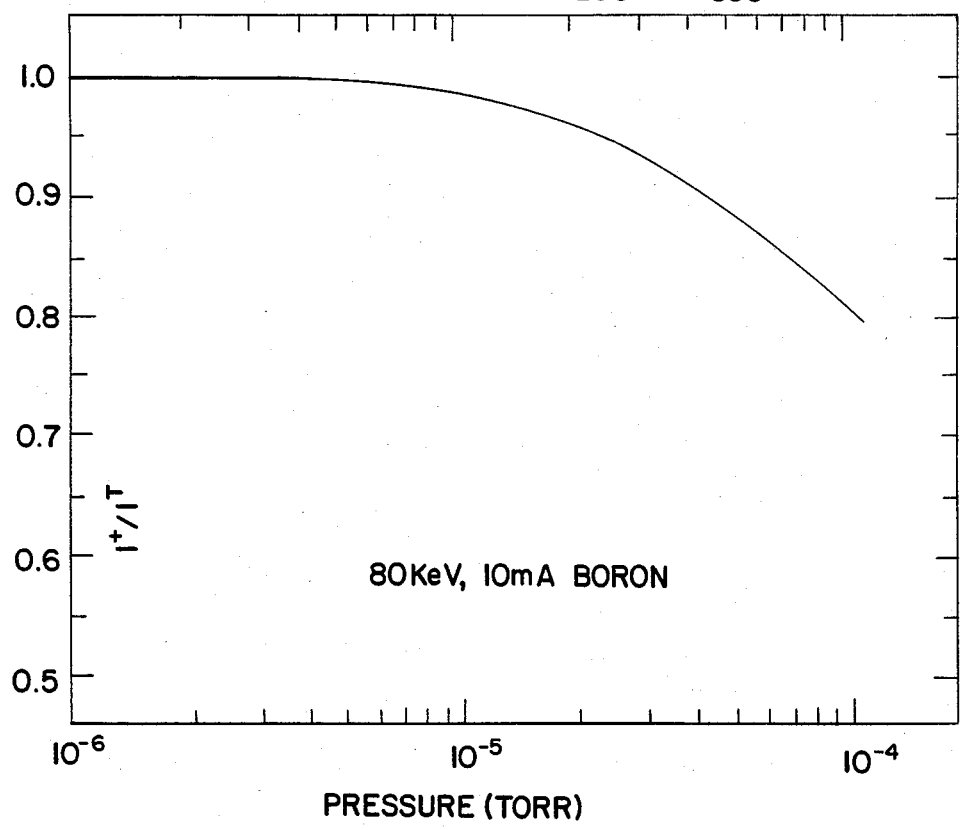
FIG. 3 is a graph showing the ratio of Faraday-measured beam current to the total beam current, as a function of end station pressure for a boron implant.

FIG. 3 illustrates the variation in the ratio of the current $I^T$ measured by the Faraday cage 7 to the total implantation current $I^+$ as a function of the pressure measured by the ionization gauge 16. The ratio $I^+/I^T$, declines with increasing pressure over the range $10^{-6}$ to $10^{-4}$ Torr so that at a pressure of $10^{-4}$ Torr, the Faraday cage reading is about 80% of the true current.

As is well known in the art, as gas pressure increases, the neutral component $I^0$ increases while the ionized current $I^+$ decreases until equilibrium values are reached; the equilibrium values depend primarily on the ion species and velocity. Over the range of pressures from $10^{-6}$ Torr to $10^{-4}$ Torr, the ratio of the neutral component into the Faraday cage 7 to the singly ionized positive component measured by the Faraday cage 7, is approximately proportional to the gas pressure.

$$\frac{I^0}{I^+} = KP \qquad (3)$$

where P is the mean pressure in the beam path and K is a constant, discussed below. The true current into the Faraday cage can therefore be written to a close approximation, as $$I^T = I^+[1 + KP] \qquad (4)$$

The value of K in equations (3) and (4) depends mainly on the ion energy and the ion and gas species. For a given set of beam and wafer parameters the value of K is fixed.

In one embodiment of the present invention, the fixed value of K is exploited in a simple manner to appropriately correct the apparent beam intensity for the changes due to pressure. In a second embodiment of the invention, account is taken of the possible changes in the value of K during an implant either as a result of changes in the beam and wafer parameters or non-linearities in the relationship between $I^0$ and $I^+$. The invention is illustrated herein by a particular ion implantation system as shown in FIG. 1, on which it has been tested. The invention is equally applicable, however, to ion implanters which have no mechanical scanning system, or which have no beam scanning provision at all.

FIXED MODE OPERATION

Figure 4:
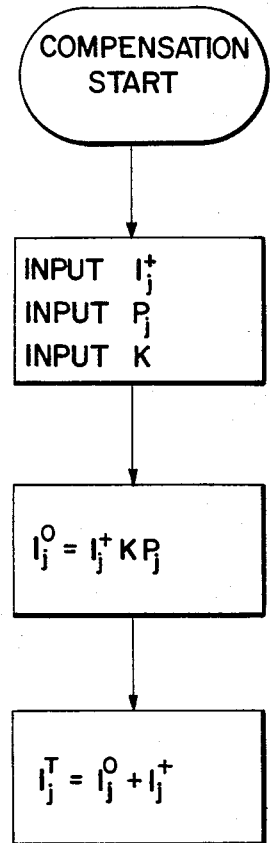
FIG. 4 is a schematic representation of the steps in the microprocessor control for a fixed-mode embodiment of the invention.

The value of K, the slope of the straight line in Equation (3), is the same for all implantations of production devices which always involve the same parameters of the beam and the wafer or other workpiece. In that case, the value of K can be stored in a microprocessor based control system 17 which controls the implant in accordance with total current, as determined from the measured current and the neutral component based upon pressure. The method is shown schematically in FIG. 4. The value P of the pressure read by the ionization gauge 16 is multiplied in microprocessor 17 by the product of the measured Faraday cage current $I^+$ and the predetermined constant K. The triple product $I^0$ is added to the Faraday cage reading, $I^+$ to yield the true implantation current signal $I_j^0 + I_j^+$, (i.e. $I_j^T$) which is input to a microprocessor-based implanter dose control system 18 for use in accordance with known practices for monitoring and control of the implantation dose.

The microprocessor 17 can store a library of K values, each appropriate for a particular beam and workpiece combination. If the relationship between $I^+$ and P is not linear but is nevertheless unique and reproducible, then a measured function K(P) can also be stored in the microprocessor 17 so that the measurement of P can be used to correct $I^+$ to yield $I^T$.

The use of a catalog of K values appropriate for every implantation configuration may not be practical for many industrial purposes since the number of measurements of K which must be performed to provide the library for the microprocessor may be prohibitively large. Moreover, it may not be possible to predict under what conditions a manufacturer will use the implanter. Also, K may not be constant during an implant. For all these reasons, the simple process control sequence shown in FIG. 4 may have limited application. For more general applications, the embodiment illustrated in FIG. 5 can be used to determine effective values of K during the implantation process itself and use the obtained values to correctly compensate the apparent Faraday cage current for the pressure-dependent neutral component.

DYNAMIC MODE OPERATION

Referring to FIG. 1, a beam of singly ionized ions selected by an analyzing magnet is sent through the vacuum to the end station 15, as discussed above. With the disk 5 rotating at a typical speed of 950 rpm, the slot 8 in the disk allows the beam to enter the Faraday cage 7 for about 750 microseconds per revolution. Thus during each revolution, the Faraday cage samples the flux of ions striking an area on the wafer 16 equal to the area of the slot. The entire disk assembly 4 is moved perpendicularly to the beam by the stepper motor 12 at a velocity $V_r$ to maintain a uniform implantation as described in U.S. Pat. No. 4,234,797. If D is the desired implantation dose, then $$V_r = C\ I^T(2N)\ /\ (nSD) \qquad (5)$$

where C is a proportionality constant, N is the number of full back and forth translation cycles along the control direction, $I^T$ is the measured beam intensity of both positive and neutral particles, expressed as the number of particles passing through the slot in the time for one revolution of the disk 5, S is the slot width, and n is the number of slots, here taken to be one. If $I^T$ is an accurate statement of the average particle current during one revolution, then the above equation gives the proper radial velocity of the disk for an accurate implantation of the desired dose D. The dose control system, as described in U.S. Pat. No. 4,234,797 must take the radial dependence into account in the on-line measurement of the value of K.

Figure 5:
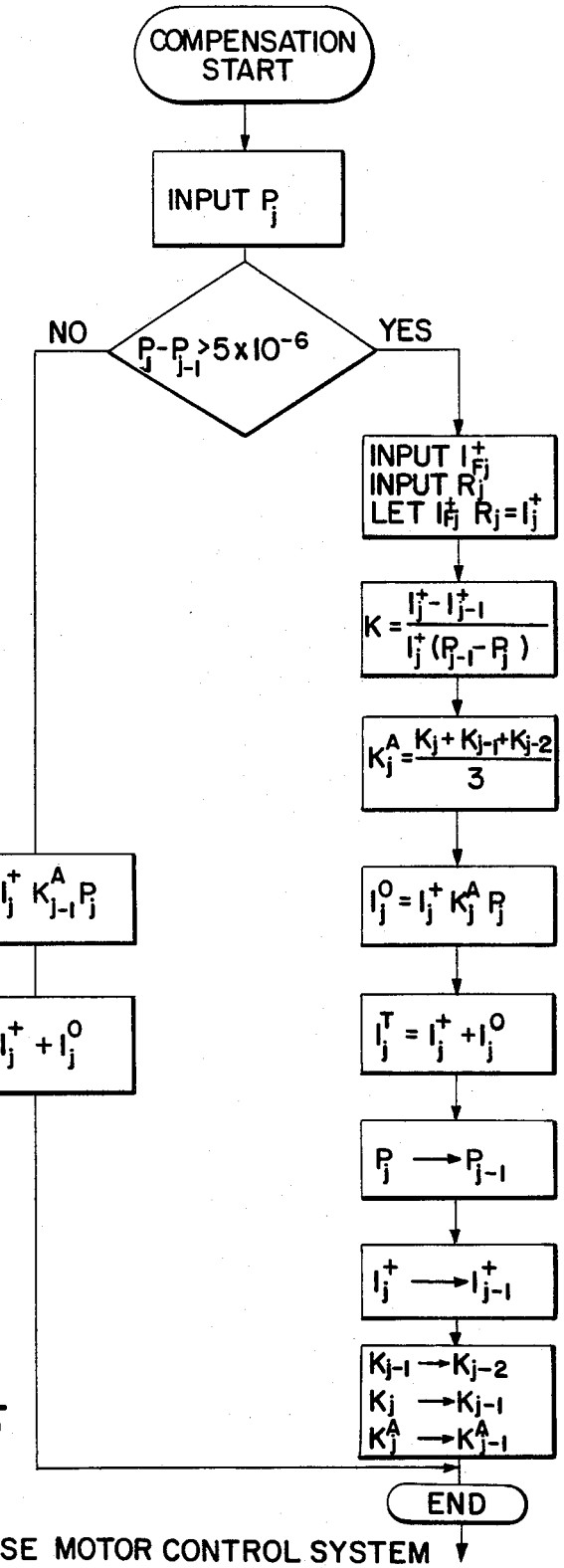
FIG. 5 is a schematic representation of the steps in the microprocessor control for a dynamic-mode embodiment of the invention.

To correct for the neutralization of the ions during implantation as a result of pressure-dependent collisions, the following steps shown schematically in FIG. 5 are executed by the microprocessor 17 for each revolution of the disk: (an index j is used herein to designate the number of the revolutions)

1. The pressure $P_j$ as measured by gauge 16 is measured once each revolution of the disk 5 during the implant and is input.
2. The pressure $P_j$ is compared with $P_{j-1}$. If the change exceeds $5 \times 10^{-6}$ Torr, the sequence continues down the right side of FIG. 5. If not, it goes to the left side branch, which is similar to step 7 below.
3. Input the average beam current $I_{Fj}{}^+$ as measured by Faraday cage 7, before correction for dependence upon the radius on the disk of the position of the beam (The subscript F indicates a reading of $I_j{}^+$ before radial correction).
4. The radial dependence of $I_{Fj}{}^+$ is eliminated by multiplying $I_{Fj}{}^+$ by the radial position of the beam 9 striking the disk 5 to produce a corrected value $I_j{}^+$.

$$I_{Fj}{}^+ R_j = I_j{}^+ \qquad (6)$$

5. The magnitude of a value of $K_j$ is derived from equation 3 using two successive sets of measurements; $I_{j-1}{}^+$, $P_{j-1}$ and $I_j{}^+$, $P_j$:

$$K_j = \frac{I^+{}_j - I^+{}_{j-1}}{I^+{}_j [P_{j-1} - P_j]} \qquad (7)$$

(In the denominator of equation 7, $I_{j-1}$ has been approximated by $I_j{}^+$).

6. The value of $K_j$ is averaged with the previous two values $K_{j-1}$ and $K_{j-2}$ to for m $K_j{}^A$, a moving average of the slope of the relative change in current versus pressure curve. The averaged value $K_j{}^A$ is stored by the microprocessor used in caculating $I^0$.
7. The value of the neutral current $I_j{}^0$ is now calculated by one of the following procedures:

$$I_j{}^0 = I_j{}^+ K_j{}^A P_j \text{ when}$$

$$P_{j-1} P_j > 5 \times 10^{-6} \text{ torr} \qquad (8a); \text{ or}$$

$$I_j{}^0 = I_j{}^+ K_{j-1}{}^A P_j \text{ when}$$

$$P_{j-1} - P_j < 5 \times 10^{-6} \text{ torr} \qquad (8b)$$

8. The neutral particle flux $I_j{}^0$ is added to the ion flux $I_j{}^+$ and used according to Equation (5) in motor control circuit 18 to vary the speed of stepper motor 12 and thus vary the traversing velocity of the disc assembly 4.

$$I_j{}^T = I_j{}^+ + I_j{}^0 \qquad (9)$$

At start-up, the operator may use the last value of K measured by the above procedures for the same combination of beam and target, or, if a new beam/target combination is used, the operator can input an approximate initial value of K appropriate to those conditions.

The effectiveness of the invention has been tested with different beams. The implantation of boron ions, in which the neutralization as a function of pressure is shown in FIG. 3, presents a severe test. (Arsenic beams, for example, have an order of magnitude weaker pressure dependence, the neutral component increases by only 2% as the path pressure increases from $10^{-6}$ to $10^{-4}$ torr.)

Some test results are summarized in Tables 1 and 2 for a boron implant into silicon wafers. The data were obtained with the invention installed in an Eaton-Nova NV-10 implantation system having an end station essentially as shown schematically in FIG. 1. The energy of the boron ions was 80 KeV, and the total dose to each wafer was $2 \times 10^{15}$ ions/cm$^2$.

The tests differed by the manner in which the pressure in the end station was varied. In both tests, the absolute dose of implant and the uniformity were determined by measuring the sheet resistance of the silicon wafer after implant. In the test shown in Table 1, three test wafers 6 were placed on the disk 5 and implanted as the implantation chamber pressure was varied continuously between $10^{-5}$ and $10^{-4}$ Torr. The results shown in the first row were obtained without the dose control system of the invention in operation, while the results in the second row were obtained with the dose control system in operation. In the test shown in Table 2, 10 wafers covered with positive photoresist were added to the three silicon test wafers on the disk, and all were implanted at the same time. The photoresist wafers caused the chamber pressure to reach $10^{-4}$ Torr during the implant, with a pressure response similar to that of FIG. 2. Thus, in both tests the pressure was varying over the range where the neutralization effects (FIG. 3) are large.

In both tables the implant conditions are given in column 1, the Faraday-measured beam current in mA in column 2, the mean value of the sheet resistance after implant, in units of ohms/square given in column 3 and standard deviation of the resistivity of three independent runs with three test wafers in each run is given in column 4. In both cases the theoretical sheet resistance expected for a dose of $2 \times 10^{15}$ ions/cm$^2$ at a pressure of $10^{-5}$ torr is 60.8 ohms/sq.

TABLE 1

| | (wafers without photoresist) | | |
|---|---|---|---|
| Conditions | Beam Current | Resistivity | Std. Deviation |
| Uncompensated | 3.1 mA | 53.55 | 0.65 |
| Compensated | 3.1 mA | 61.57 | 0.64 |

TABLE 2

| | (includes wafers with photoresist) | | |
|---|---|---|---|
| Conditions | Beam Current | Resistivity | Std. Deviation |
| Uncompensated | 3.18 mA | 54.15 | 0.66 |
| Compensated | 3.25 mA | 60.16 | 0.72 |

In both tests, the sheet resistivity of the wafers was considerably lower than the value of 60.8 ohms/square expected, specifically by 11.9% in the first test, and by 10.9% in the second. When the dose control system of the invention was operating, the resistivity values were within 1.3% and 1.1% of the accepted value. A lower resistivity is the result of a larger implantation dose. In this dose range the slope of resistivity versus dose is −0.94 so that the uncompensated implants received 16% and 12% larger doses than did the compensated wafers in the two respective tests. The uncompensated doses were high as a result of implantation by neutralized ions which were not detected in the Faraday cage. The large neutralization effects observed in these tests are quite consistent with the effects expected from the neutralization versus pressure curve of FIG. 3.

As shown by the above results, the described embodiment of the invention reduces the effects of pressure by about a factor of 10 as compared to an uncompensated system.

The invention is not restricted to implantations into rotating or translating workpieces. The workpiece can be moving or stationary with respect to the beam. All that is required is a periodic measurement of the pressure and a knowlege or measurement of the pressure-neutralization relation. The invention is also not restricted to ion implantation into photoresist surfaces. Nor is it restricted to the implantation into semiconductors. It is a general method for compensating for the effects of pressure on the apparent ion beam current from whatever cause. The pressure in the implanter vessel may change because of the volatility or the sputtering or the outgassing of the workpiece, or because of ion beam effects in the implanter chamber.

The invention is not restricted to the case where the relationship between pressure and neutralization is linear. All that is required is that the time dependence of the pressure variation be slow enough compared to the response time of the measurements so that, over a successive set of measurements, the relationship between pressure and neutralization can be described by the linear term in the power series expansion of the actual functional dependence. The embodiment described in FIG. 1 has a response time of 0.07 seconds as compared to the 2 seconds it takes for a pressure rise from $10^{-5}$ to $10^{-4}$, FIG. 2. Such a pressure rise leads to a 2% change in $I^+$ for boron implants, FIG. 3. Thus, 30 measurements are made during a 20% change in $I^+$. The uncertainty of measuring K P [equation (3)] is therefore less than 1% for boron.

The response time of the system described in the embodiment of FIG. 1 is determined by the fact that the Faraday current is sampled only once per revolution of the workpiece holder. Response times of 10 milliseconds or shorter could be readily obtained by sampling more frequently.

I claim:

1. A method for controlling the dose of ions implanted into a workpiece by an ion implanter comprising the steps of measuring the ionized beam current at the workpiece, determining the current of the neutral atoms present in the beam striking the workpiece, adding the ionized beam current and the neutral beam current to obtain an effective beam current, and varying the dose of implantation as a function of the effective beam current.

2. The method as claimed in claim 1, in which the neutral beam current is determined by measuring the gas pressure within the implantation volume; and converting the pressure measurement into a corresponding current measurement in accordance with a known relationship among the gas pressure, the measured ionized beam current, and the neutral beam current.

3. The method as claimed in claim 1, in which the effective beam current is determined by measuring the gas pressure within the implantation volume, and calculating the effective beam current by means of the equation $$I^T = I^+(1+KP),$$

where $I^T$ is the effective beam current, $I^+$ is the measured ionized beam current, and K is a constant which depends on ion and gas species and ion velocity, P is the pressure measured in the implantation volume.

4. The method as claimed in claim 3, including storing a plurality of K values in a microprocessor, inputting a signal corresponding to the measured beam current into the microprocessor, inputting a signal corresponding to the pressure of the implantation volume into the microprocessor, said microprocessor generating an output signal based on a selected K value corresponding to the effective beam current, and inputting said effective beam current signal into an implantation dose control system of said ion implanter.

* * * * *